(12) United States Patent
Hoehn (10) Patent No.: US 11,282,774 B2
(45) Date of Patent: Mar. 22, 2022

(54) POWER SEMICONDUCTOR MODULE ARRANGEMENT

(71) Applicant: Infineon Technologies AG, Neubiberg (DE)

(72) Inventor: Alexander Hoehn, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/867,074

(22) Filed: May 5, 2020

(65) Prior Publication Data

US 2020/0357731 A1    Nov. 12, 2020

(30) Foreign Application Priority Data

May 6, 2019  (EP) ..................... 19172723

(51) Int. Cl.
*H01L 23/48* (2006.01)
*H01L 23/498* (2006.01)

(52) U.S. Cl.
CPC .............................. *H01L 23/49822* (2013.01)

(58) Field of Classification Search
CPC ......... H01L 23/49822; H01L 23/49811; H01L 23/053; H01L 23/049
See application file for complete search history.

(56) References Cited

U.S. PATENT DOCUMENTS

| | | | |
|---|---|---|---|
| 5,751,058 A | 5/1998 | Matsuki | |
| 10,008,392 B2 * | 6/2018 | Hoehn | ................. H01L 23/053 |
| 10,020,237 B2 * | 7/2018 | Hoehn | ................. H01L 21/4885 |
| 2007/0187817 A1 | 8/2007 | Popp | |
| 2010/0065962 A1 | 3/2010 | Bayerer et al. | |
| 2011/0273861 A1 * | 11/2011 | Matsumoto | ............. H01L 23/04 361/820 |
| 2013/0056883 A1 | 3/2013 | Furukawa | |
| 2013/0270688 A1 | 10/2013 | Ikuta et al. | |

(Continued)

FOREIGN PATENT DOCUMENTS

| | | |
|---|---|---|
| EP | 2816599 A2 | 12/2014 |
| JP | 2003068979 A | 3/2003 |

(Continued)

*Primary Examiner* — Nicholas J Tobergte
(74) *Attorney, Agent, or Firm* — Murphy, Bilak & Homiller, PLLC (57) ABSTRACT

A power semiconductor module arrangement includes a semiconductor substrate arranged in a housing, and a mounting arrangement including a frame or body, and at least one terminal element coupled to the frame or body. The mounting arrangement is inserted in and coupled to the housing. The mounting arrangement has a lower surface which, when the mounting arrangement is inserted in and coupled to the housing, rests on at least one contact surface of the housing. When the mounting arrangement is inserted in and coupled to the housing, the at least one terminal element mechanically and electrically contacts the semiconductor substrate with a first end, and a distance between an upper surface of the semiconductor substrate and the at least one contact surface in a vertical direction equals a length of the first end between the upper surface of the semiconductor substrate and the lower surface of the mounting arrangement.

11 Claims, 4 Drawing Sheets

(56) References Cited

U.S. PATENT DOCUMENTS

2013/0277819 A1 10/2013 Yoshida
2016/0254255 A1 9/2016 Hori et al.
2017/0125322 A1 5/2017 Spann et al.
2018/0138100 A1 5/2018 Iwahashi

FOREIGN PATENT DOCUMENTS

WO 2015176985 A1 11/2015
WO 2018202620 A1 11/2018

* cited by examiner

POWER SEMICONDUCTOR MODULE ARRANGEMENT

TECHNICAL FIELD

The instant disclosure relates to a power semiconductor module arrangement.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the semiconductor substrate by soldering or sintering techniques.

Electrical lines or electrical connections are used to connect different semiconductor devices of the power semiconductor arrangement. Further, terminal elements are provided to contact the semiconductor arrangement from outside the housing. Such terminal elements are usually electrically coupled to the first metallization layer with a first end. A second end of the terminal elements protrudes outside the housing.

There is a need for a power semiconductor module arrangement wherein terminal elements may be easily mounted and wherein tolerances that may occur due to process related reasons or due to varying thicknesses of the semiconductor substrate may be easily compensated.

SUMMARY

A power semiconductor module arrangement includes a semiconductor substrate arranged in a housing, wherein at least one semiconductor body is arranged on an upper surface of the semiconductor substrate, and a mounting arrangement including a frame or body, and at least one terminal element coupled to the frame or body. The mounting arrangement is inserted in and coupled to the housing. The mounting arrangement includes a lower surface which, when the mounting arrangement is inserted in and coupled to the housing, rests on at least one contact surface of the housing. When the mounting arrangement is inserted in and coupled to the housing, each of the at least one terminal elements mechanically and electrically contacts the semiconductor substrate with a first end. When the mounting arrangement is inserted in and coupled to the housing, a distance between an upper surface of the semiconductor substrate and the at least one contact surface in a vertical direction equals a length of the first end between the upper surface of the semiconductor substrate and the lower surface of the mounting arrangement, wherein the vertical direction is a direction perpendicular to the upper surface of the semiconductor substrate.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
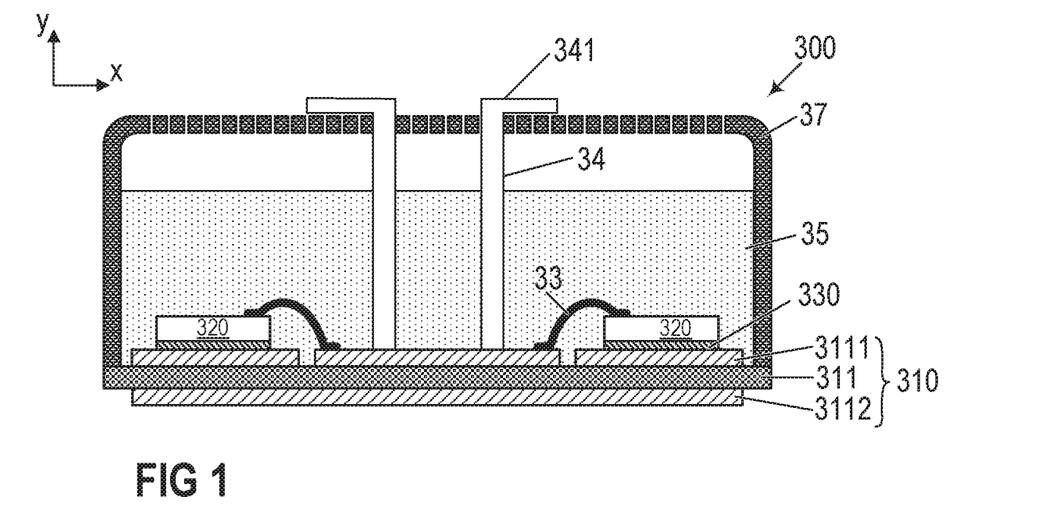
FIG. 1 is a cross-sectional view of a power semiconductor module arrangement.

Referring to FIG. 1, a cross-sectional view of a power semiconductor module arrangement 300 is schematically illustrated. The power semiconductor module arrangement 300 includes a housing 37 and a semiconductor substrate 310. The semiconductor substrate 310 includes a dielectric insulation layer 311, a (structured) first metallization layer 3111 attached to the dielectric insulation layer 311, and a second (structured) metallization layer 3112 attached to the dielectric insulation layer 311. The dielectric insulation layer 311 is disposed between the first and second metallization layers 3111, 3112.

Each of the first and second metallization layers 3111, 3112 may consist of or include one of the following materials: copper; a copper alloy; aluminum; an aluminum alloy; any other metal or alloy that remains solid during the operation of the power semiconductor module arrangement. The semiconductor substrate 310 may be a ceramic substrate, that is, a substrate in which the dielectric insulation layer 311 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 310 may, e.g., be a Direct Copper Bonding (DCB) substrate, a Direct Aluminum Bonding (DAB) substrate, or an Active Metal Brazing (AMB) substrate. Further, the substrate 310 may be an Insulated Metal Substrate (IMS). An Insulated Metal Substrate generally comprises a dielectric insulation layer 311 comprising (filled) materials such as epoxy resin or polyimide, for example. The material of the dielectric insulation layer 311 may be filled with ceramic particles, for example. Such particles may comprise, e.g., $Si_2O$, $Al_2O_3$, AlN, or BrN and may have a diameter of between about 1 μm and about 50 μm. The substrate 310 may also be a conventional printed circuit board (PCB) having a non-ceramic dielectric insulation layer 311. For instance, a non-ceramic dielectric insulation layer 311 may consist of or include a cured resin.

The semiconductor substrate 310 is arranged in a housing 37. In the example illustrated in FIG. 1, the semiconductor substrate 310 forms a ground surface of the housing 37, while the housing 37 itself solely comprises sidewalls and a cover. This is, however, only an example. It is also possible that the housing 37 further comprises a ground surface and the semiconductor substrate 310 be arranged inside the housing 37. According to another example, the semiconductor substrate 310 may be mounted on a base plate (not illustrated in FIG. 1). In some power semiconductor module arrangements 300, more than one semiconductor substrate 310 is arranged on a single base plate (not illustrated). The base plate may form a ground surface of the housing 37, for example.

One or more semiconductor bodies 320 may be arranged on the at least one semiconductor substrate 310. Each of the semiconductor bodies 320 arranged on the at least one semiconductor substrate 310 may include a diode, an IGBT (Insulated-Gate Bipolar Transistor), a MOSFET (Metal-Oxide-Semiconductor Field-Effect Transistor), a HET (Junction Field-Effect Transistor), a HEMT (High-Electron-Mobility Transistor), or any other suitable semiconductor element.

The one or more semiconductor bodies 320 may form a semiconductor arrangement on the semiconductor substrate 310. In FIG. 1, only two semiconductor bodies 320 are exemplarily illustrated. The second metallization layer 3112 of the semiconductor substrate 310 in FIG. 1 is a continuous layer. The first metallization layer 3111 is a structured layer in the example illustrated in FIG. 1. "Structured layer" means that the first metallization layer 3111 is not a continuous layer, but includes recesses between different sections of the layer. Such recesses are schematically illustrated in FIG. 1. The first metallization layer 3111 in this example includes three different sections. This, however, is only an example. Any other number of sections is possible. Different semiconductor bodies 320 may be mounted to the same or to different sections of the first metallization layer 3111. Different sections of the first metallization layer may have no electrical connection or may be electrically connected to one or more other sections using, e.g., bonding wires 33. Electrical connections 33 may also include connection plates or conductor rails, for example, to name just a few examples.

The one or more semiconductor bodies 320 may be electrically and mechanically connected to the semiconductor substrate 310 by an electrically conductive connection layer 330. Such an electrically conductive connection layer may be a solder layer, a layer of an electrically conductive adhesive, or a layer of a sintered metal powder, e.g., a sintered silver powder, for example.

According to other examples, it is also possible that the second metallization layer 3112 is a structured layer. It is further possible to omit the second metallization layer 3112. It is also possible that the first metallization layer 3111 is a continuous layer, for example.

The power semiconductor module arrangement 300 illustrated in FIG. 1 further includes terminal elements 34. The terminal elements 34 are electrically connected to the first metallization layer 3111 and provide an electrical connection between the inside and the outside of the housing 37. The terminal elements 34 may be electrically connected to the first metallization layer 3111 with a first end, while a second end 341 of the terminal elements 34 protrudes out of the housing 37. The terminal elements 34 may be electrically contacted from the outside at their second end 341. A first part of the terminal elements 34 may extend through the inside of the housing 37 in a vertical direction y. The vertical direction y is a direction perpendicular to a top surface of the semiconductor substrate 310, wherein the top surface of the semiconductor substrate 310 is a surface on which the at least one semiconductor body 320 is mounted. The second ends 341 of the terminal elements 34 may be bent such that they extend in a first horizontal direction x which is parallel to the top surface of the semiconductor substrate 310. In this way it may be easier to electrically contact the second ends 341. The terminal elements 34 illustrated in FIG. 1, however, are only examples. Terminal elements 34 may be implemented in any other way and may be arranged anywhere within the housing 37. For example, one or more terminal elements 34 may be arranged close to or adjacent to the sidewalk of the housing 37, Terminal elements 34 could also protrude through the sidewalks of the housing 37 instead of through the cover. It is also possible that the second ends 341 extend in the vertical direction y instead of being bent in the first horizontal direction x. Any other suitable implementation is possible.

The semiconductor bodies 320 each may include a chip pad metallization (not specifically illustrated), e.g., a source, drain, anode, cathode, or gate metallization. A chip pad metallization generally provides a contact surface for electrically connecting the semiconductor body 320. The chip pad metallization may electrically contact a connection layer 330, a terminal element 34, or an electrical connection 33, for example. A chip pad metallization may consist of or include a metal such as aluminum, copper, gold, or silver, for example. The electrical connections 33 and the terminal elements 34 may also consist of or include a metal such as copper, aluminum, gold, or silver, for example.

According to one example, the at least two semiconductor bodies 320 may be arranged in a half-bridge configuration. Any other arrangements, however, are also possible.

The terminal elements 34 may be soldered or welded to one of the at least one semiconductor substrate 310. For example, the terminal elements 34 may be mechanically and electrically coupled to one of the at least one semiconductor substrate 310 by means of an ultrasonic welding process. Generally, the terminal elements 34 may simply be arranged on one of the at least one semiconductor substrates 310 and may extend through the inside of the housing 37 and further through the cover to the outside of the housing 37. However, simply arranging separate terminal elements 34 that are configured to contact different electrical potentials next to each other within the housing may result in unwanted creeping currents. Further, during the process of arranging and mounting the different elements inside the housing, the terminal elements 34 may be damaged unintentionally.

Figure 2A:
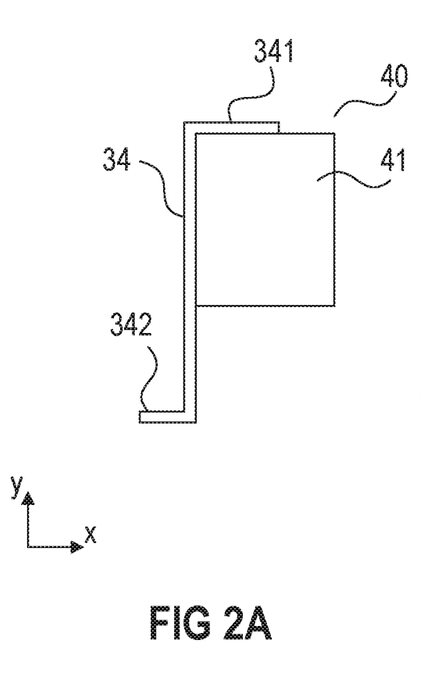
FIGS. 2A to 2C schematically illustrate cross-sectional views of a mounting arrangement for mounting terminal elements.
Figure 2B:
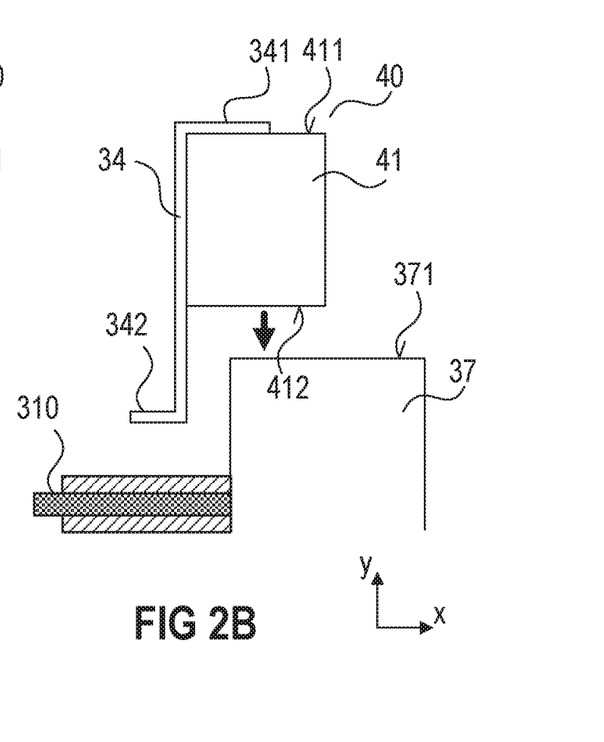
Figure 2C:
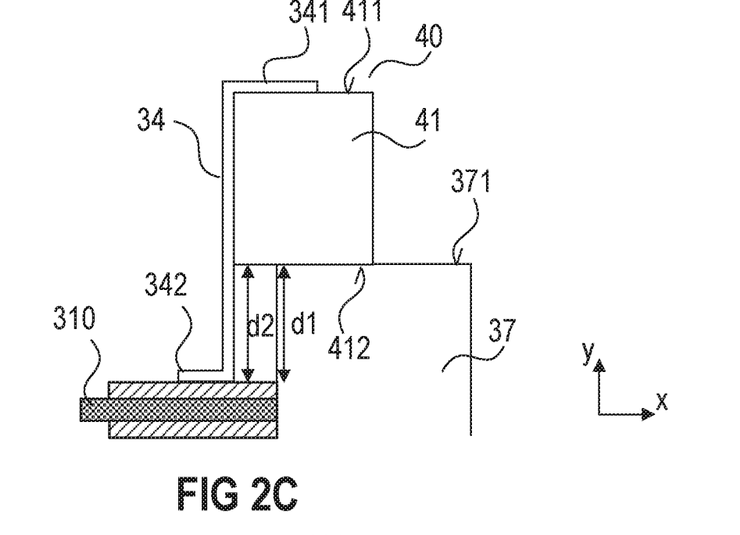

Referring to FIGS. 2A to 2C, the power semiconductor module arrangement 300 of FIG. 1 may further comprise a mounting arrangement 40 for mounting one or more terminal elements 34 to the housing 37. According to one example, the housing 37 may only comprise sidewalls. The mounting arrangement 40 may comprise a frame or body 41. The frame or body 41 may be dielectrically insulating. The frame or body 41 may be inserted into the housing 37 and may comprise mounting parts (not specifically illustrated in FIGS. 2A to 2C). Such mounting parts may be inserted into corresponding counterparts in the sidewalls of the housing 37. For example, the mounting parts may comprise pins, braces, or hooks which may be inserted into corresponding counterparts such as slots or holes within the frame of the housing 37. The mounting parts may firmly engage with the corresponding counterparts such that the mounting arrangement 40 is firmly attached to the housing 37. The frame or body 41 of the mounting arrangement 40, when mounted to the housing 37, may form at least a part of a cover of the housing 37. One or more electrically conducting terminal elements 34 may be coupled to or extend through the frame or body 41 of the mounting arrangement 40. When the mounting arrangement 40 is mounted to the housing 37, a second end 341 of the terminal elements 34 may protrude out of the housing 37 such that it may be contacted from outside the housing 37. A first end 342 of the terminal elements 34 protrudes from the mounting arrangement 40 towards the semiconductor substrate 310. Each of the first ends 342 of the terminal elements 34 may contact one of the sections of the first metallization layer 3111. For example, the first ends 342 may be soldered, welded, or sintered to the first metallization layer 3111.

Referring to FIG. 2A, a frame or body 41 with a terminal element 34 connected thereto is schematically illustrated. In the example illustrated in FIG. 2A, the terminal element 34 is arranged adjacent to a sidewall of the frame or body 41. That is, the terminal element 34 is arranged on the outside of the frame or body 41 and does not extend through the frame or body 41. The second end 341 of the terminal element 34 is bent such that it extends along a top surface 411 of the frame or body 41 and may be more easily contacted. A top surface of the frame or body 41 is a surface that, when the mounting arrangement 40 is mounted to the frame 37, faces away from the at least one semiconductor substrate 310 arranged inside the housing 37. Arranging a terminal element 34 on the outside of the frame or body 41, however, is only an example. It is also possible that the terminal element 34 at least partly extends through the inside of the frame or body 41. That is, part of a terminal element 34 may be enclosed by the frame or body 41, with at least the first end 342 and the second end 341 extending outside the frame or body 41.

Referring to FIG. 2B, the mounting arrangement 40 of FIG. 2A is schematically illustrated in relation to a semiconductor substrate 310 and a section of the housing 37. The housing 37 may comprise at least one contact surface 371. When mounted to the housing 37, the mounting arrangement 40 comes to rest at least on this contact surface 371. In particular, a lower surface 412 of the mounting arrangement 40 is arranged on (adjoins) the contact surface 371 when the mounting arrangement 40 is mounted to the housing 37. In this way, the at least one contact surface 371 forms a lower end-stop for the mounting arrangement 40 and prevents the mounting arrangement from being inserted further into the housing 37. This is schematically illustrated in FIG. 2C. The height d1 of the contact surface 371 with respect to a top surface of the semiconductor substrate 310 equals a distance between the top surface of the semiconductor substrate 310 and the lower surface 412 of the mounting arrangement 40. The top surface of the semiconductor substrate 310 is a surface of the first metallization layer 3111 on which the at least one semiconductor body 320 is mounted.

The length d2 of the first end 342 of the terminal element 34 which extends from the lower surface 412 of the frame or body 41 towards the semiconductor substrate 310 may be chosen to equal the distance d1 between the top surface of the semiconductor substrate 310 and the contact surface 371. In this way, when the frame or body 41 comes to rest on the contact surface 371, the first end 342 of the terminal element 34 comes to rest on the top surface of the semiconductor substrate 310. No further bending of the first end 342 is necessary. This is schematically illustrated in FIG. 2C. In FIG. 2C, however, only a section of the housing 37 which forms the contact surface 371 is schematically illustrated. Those parts of the housing that are not relevant for understanding the general principle have been omitted. The contact surface 371, for example, may be formed by a protrusion, a recess, or an indentation of the housing 37, in particular, by a protrusion, a recess or an indentation of a sidewall of the housing 37.

Figure 3A:
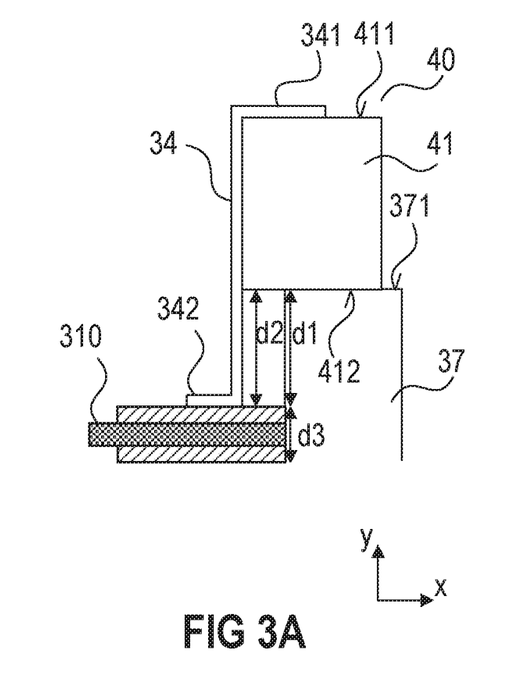
FIGS. 3A and 3B schematically illustrate further cross-sectional views of a mounting arrangement for mounting terminal elements.

As is schematically illustrated in FIG. 3A, the semiconductor substrate 310 may have a certain thickness d3 in a vertical direction y that is perpendicular to the top surface of the semiconductor substrate 310. Different kinds of substrates 310, however, may have different thicknesses d3. For example, an AMB-Substrate may have a thickness of about 1 mm. This, however, is only an example. An AMB-Substrate could also be thinner and have a thickness d3 of about 0.63 mm or anything between 0.5 mm and 1.5 mm. Other kinds of substrates 310 may have even greater or smaller thicknesses d3. For example, an $Al_2O_3$-Substrate (dielectric insulation layer 311 comprises $Al_2O_3$) may have a thickness d3 of about 0.32 mm.

Figure 3B:
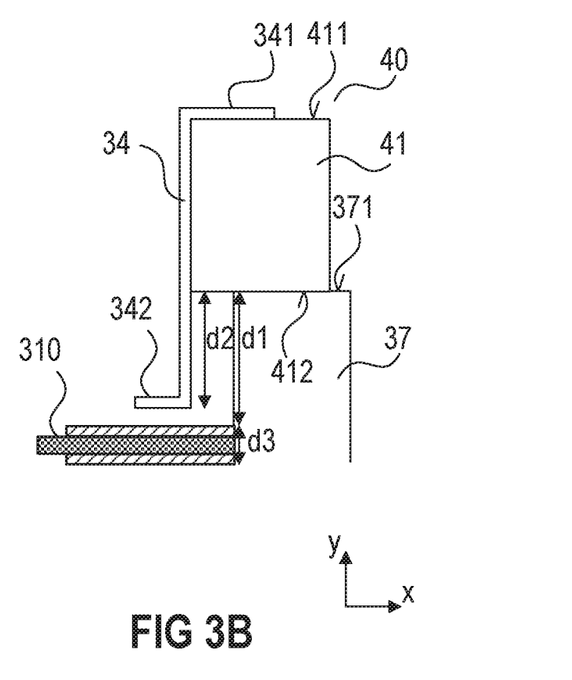

A semiconductor substrate 310 having a thickness d3 which is smaller than the thickness d3 of the substrate 310 of FIG. 3A is schematically illustrated in FIG. 3B. As can be seen in FIG. 3B, the distance d1 between the top surface of the semiconductor substrate 310 and the contact surface 371 increases, as compared to the distance d1 between the top surface of the semiconductor substrate 310 and the contact surface 371 of the arrangement of FIG. 3A. If the same housing 37 and the same mounting arrangement 40 is used in a power semiconductor module arrangement including a thinner substrate 310, the dimensions of the different elements are no longer compatible. As can be seen in FIG. 3B, the first end 342 of the terminal element 34 does not reach down to the semiconductor substrate 310. Therefore, no contact can be made between the first end 342 of the terminal element 34 and the semiconductor substrate 310.

Figure 4A:
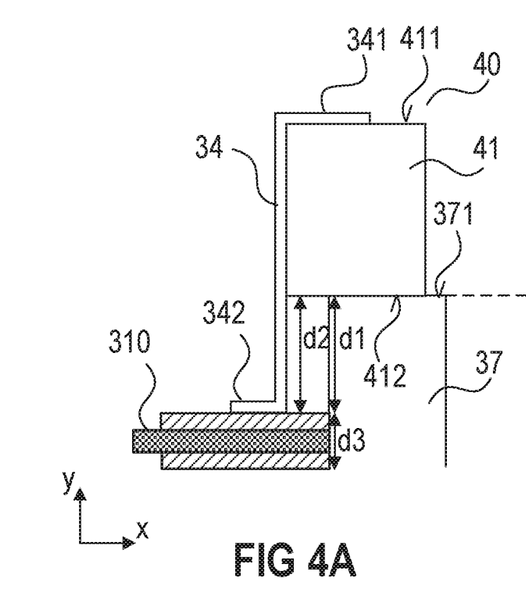
FIGS. 4A and 4B schematically illustrate further cross-sectional views of a mounting arrangement for mounting terminal elements.
Figure 4B:
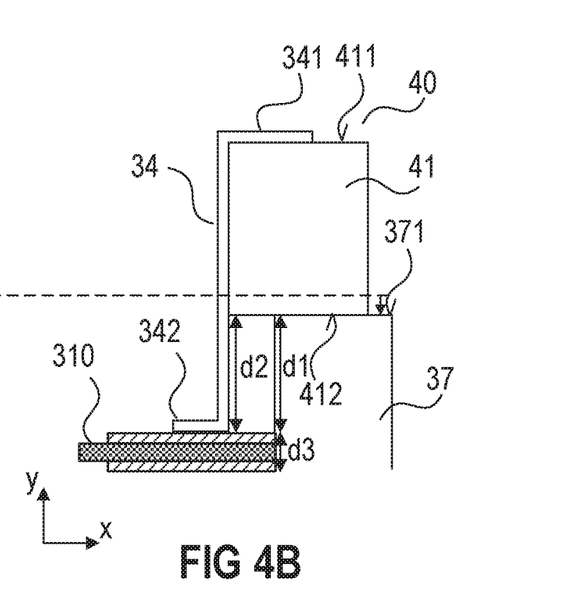

The arrangement illustrated in FIG. 4A corresponds to the arrangement of FIG. 3A. Referring to FIG. 4B, if a thinner semiconductor substrate 310 is arranged within the power semiconductor module arrangement, the contact surface 371 may be arranged at a different height d4 with respect to a lower surface of the semiconductor substrate 310. The distance d1 between the top surface of the semiconductor substrate 310 and the contact surface 371 may be the same as in the arrangement of FIG. 4A. The smaller thickness d3 of the semiconductor substrate 310, however, may be compensated by the altered height d4 of the contact surface 371. As the distance d1 between the semiconductor substrate 310 and the contact surface 371 remains constant, the same mounting arrangement 40 may be used as in the arrangement of FIG. 4A.

Usually, the terminal elements 34 are comparably thick. The first ends 342 are often pre-bent before selling the mounting arrangement and before mounting the mounting arrangement 40 to the housing 37. With the first end 342 being comparably thick, it is difficult to modify the distance d2 between the lowest point of the first end 342 of the terminal element 34 and the lower surface 412 of the frame or body 41 in order to adapt it to different thicknesses d3 of a semiconductor substrate 310. Therefore, the mounting arrangement 40 itself remains unaltered, but the insertion depth of the mounting arrangement 40 in the housing 37 changes in order to adapt the arrangement to different semiconductor substrate thicknesses d3.

Figure 5:
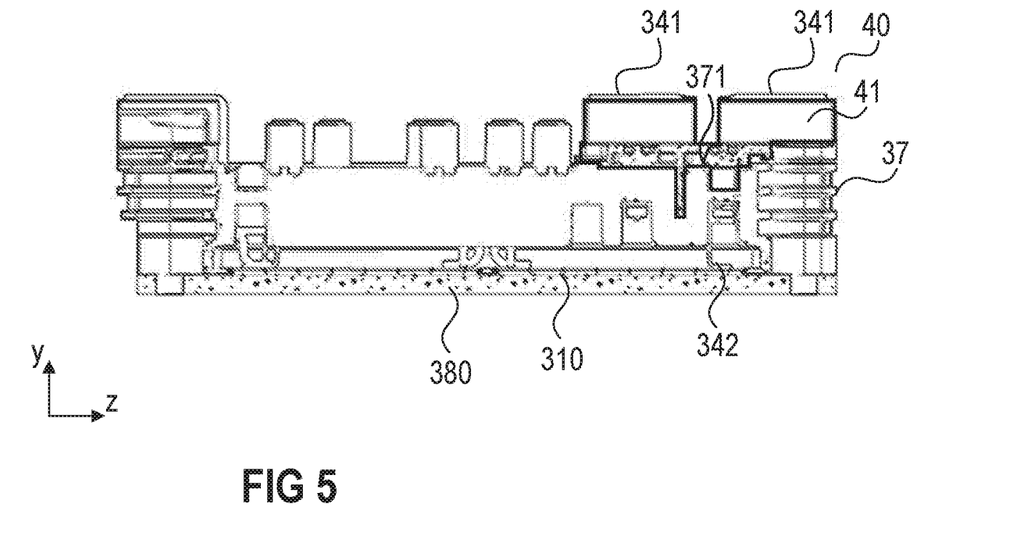
FIG. 5 schematically illustrates a cross-sectional view of a power semiconductor module arrangement including a mounting arrangement for arranging terminal elements within a housing.

Referring to FIG. 5, an exemplary cross-sectional view of a semiconductor module arrangement 300 comprising a mounting arrangement 40 is schematically illustrated. The mounting arrangement 40 is inserted into the housing 37. The contact surface 371 is schematically indicated in the side view of FIG. 5.

Figure 6:
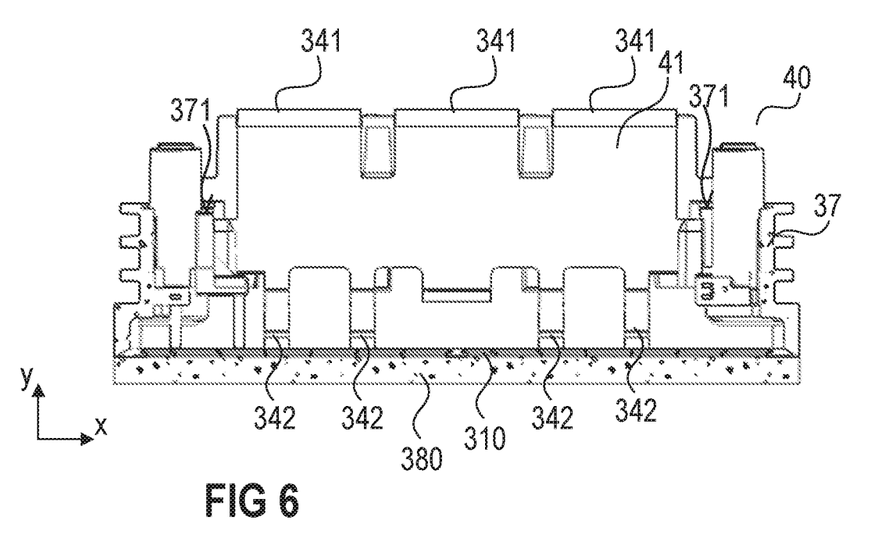
FIG. 6 schematically illustrates another cross-sectional view of a power semiconductor module arrangement including a mounting arrangement for arranging terminal elements within a housing.

Referring to FIG. 6, a cross-sectional view of a power semiconductor module arrangement 300 comprising a mounting arrangement 40 for arranging at least one terminal element 34 inside the housing 37 is exemplarily illustrated. A semiconductor substrate 310 is arranged on a base plate 380 within the housing 37. A mounting arrangement 40 is inserted into the housing 37. The mounting arrangement 40 rests on at least one contact surface 371 of the housing 37. In the example of FIG. 6, the mounting arrangement 40 comprises one terminal element 34. However, the terminal element 34 in FIG. 6 comprises four separate first ends 342 and three separate second ends 341. This, however, is only an example. A terminal element 34 generally may comprise any suitable number of first ends 342 and second ends 341, wherein the number of first ends 342 may be equal to or may differ from the number of second ends 341.

The mounting arrangement 40, for example, may rest on two opposite sidewalls of the housing 37. For example, a first contact surface 371 may be formed by a first sidewall of the housing 37, and a second contact surface 371 may be formed by a second sidewalls of the housing 37 which is opposite to the first sidewall. The mounting arrangement 40 may be inserted into the housing 37 such that it rests on the first and the second contact surface 371. In this final mounting position, the first end 342 of the terminal element 34 of the mounting arrangement 40 is in contact with the semiconductor substrate 310 arranged inside the housing 37.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein, Therefore, it is intended that this invention be limited only by the claims and the equivalents thereof.

What is claimed is:

1. A power semiconductor module arrangement, comprising:
   a semiconductor substrate arranged in a housing, wherein at least one semiconductor body is arranged on an upper surface of the semiconductor substrate; and
   a mounting arrangement comprising a frame or body, and at least one terminal element coupled to the frame or body,
   wherein the mounting arrangement is inserted in and coupled to the housing,
   wherein the mounting arrangement comprises a lower surface which, when the mounting arrangement is inserted in and coupled to the housing, rests on at least one contact surface of the housing,
   wherein when the mounting arrangement is inserted in and coupled to the housing, the at least one terminal element mechanically and electrically contacts the semiconductor substrate with a first end,
   wherein when the mounting arrangement is inserted in and coupled to the housing, a distance between an upper surface of the semiconductor substrate and the at least one contact surface in a vertical direction equals a length of the first end between the upper surface of the semiconductor substrate and the lower surface of the mounting arrangement,
   wherein the vertical direction is a direction perpendicular to the upper surface of the semiconductor substrate,
   wherein the housing has an open bottom such that the semiconductor substrate or a base plate to which the semiconductor substrate is mounted forms a ground surface of the housing.

2. The power semiconductor module arrangement of claim 1, wherein the at least one contact surface forms a lower end-stop for the mounting arrangement.

3. The power semiconductor module arrangement of claim 1, wherein the at least one contact surface is formed by a protrusion, a recess, or an indentation of the housing.

4. The power semiconductor module arrangement of claim 3, wherein the at least one contact surface is formed by a protrusion, a recess, or an indentation of a sidewall of the housing.

5. The power semiconductor module arrangement of claim 4, wherein a first contact surface is formed at a first sidewall of the housing and a second contact surface is formed on a second sidewall of the housing opposite to the first sidewall.

6. The power semiconductor module arrangement of claim 1, wherein the semiconductor substrate has a thickness of between 0.3 mm and 1.5 mm in the vertical direction.

7. The power semiconductor module arrangement of claim 1, wherein the first end of the at least one terminal element is welded or soldered to the semiconductor substrate.

8. The power semiconductor module arrangement of claim 1, wherein the at least one terminal element is arranged on and extends partly along a surface of the frame or body of the mounting arrangement.

9. The power semiconductor module arrangement of claim 1, wherein the semiconductor substrate is a Direct Copper Bonding (DCB) substrate, a Direct Aluminum Bonding (DAB) substrate, an Active Metal Brazing (AMB), an Insulated Metal Substrate (IMS), or a printed circuit board (PCB).

10. The power semiconductor module arrangement of claim 1, wherein when the mounting arrangement is inserted in and coupled to the housing, the at least one terminal element comprises at least one second end extending in a horizontal direction which is parallel to the top surface of the semiconductor substrate.

11. The power semiconductor module arrangement of claim 1, wherein a second end of the at least one terminal element extends along a top surface of the frame or body opposite the lower surface, wherein an intermediate part of the at least one terminal element extends along a side surface of the frame or body, and wherein the side surface of the frame or body faces inward and extends between the top surface and the lower surface of the frame or body.

* * * * *